US007122965B2

(12) United States Patent
Goodman

(10) Patent No.: US 7,122,965 B2
(45) Date of Patent: *Oct. 17, 2006

(54) METHODS AND APPARATUS FOR CALIBRATION AND METROLOGY FOR AN INTEGRATED RF GENERATOR SYSTEM

(75) Inventor: Daniel Goodman, Lexington, MA (US)

(73) Assignee: MKS Instruments, Inc., Wilmington, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/897,580

(22) Filed: Jul. 23, 2004

(65) Prior Publication Data

US 2005/0057165 A1 Mar. 17, 2005

Related U.S. Application Data

(63) Continuation of application No. 10/373,163, filed on Feb. 24, 2003, now Pat. No. 6,781,317.

(51) Int. Cl.
*H01J 7/24* (2006.01)
(52) U.S. Cl. .............................. 315/111.21; 315/111.51
(58) Field of Classification Search .................... None
See application file for complete search history.

(56) References Cited

U.S. PATENT DOCUMENTS

| 5,472,561 | A | 12/1995 | Williams et al. .......... 156/627.1 |
| 5,543,689 | A | 8/1996 | Ohta et al. .............. 315/111.21 |
| 5,643,364 | A | 7/1997 | Zhao et al. .............. 118/723 E |
| 6,239,587 | B1 | 5/2001 | Buck ............................ 324/95 |
| 6,333,634 | B1 | 12/2001 | Haze et al. .................. 324/709 |
| 6,462,483 | B1 | 10/2002 | Jeng et al. | |
| 6,646,385 | B1 | 11/2003 | Howald et al. | |
| 6,781,317 | B1* | 8/2004 | Goodman .............. 315/111.21 |
| 2002/0026251 | A1 | 2/2002 | Johnson et al. ............... 700/67 |
| 2002/0159216 | A1 | 10/2002 | Ennis ......................... 361/234 |

FOREIGN PATENT DOCUMENTS

WO  WO 02/080220 A1  10/2002

OTHER PUBLICATIONS

Abraham et al., "Ion Energy Distributions Versus Frequency And Ion Mass At The RF-Biased Electrode In An Inductively Driven Discharge," *J. Vac. Sci. Technol. A*, Sep./Oct. 2002, vol. 20, pp. 1759-1768.

(Continued)

*Primary Examiner*—David Vu
(74) *Attorney, Agent, or Firm*—Proskauer Rose, LLP

(57) ABSTRACT

The invention features RF plasma generation systems, methods for operating the systems, methods for calibrating the systems, and calibration apparatus. One RF plasma generation system includes an impedance matching network having an input port to receive an RF signal from an RF generator, and an output port to deliver the RF signal to an input port of a plasma vessel associated with a load. The system includes an RF signal probe in electromagnetic communication with the input port of the impedance matching network to detect at least one RF signal parameter associated with the RF signal at the input port of the impedance matching network. The system can include a calibration storage unit that stores calibration data. The calibration data includes an association of values of the RF signal parameter with values of at least one characteristic of the load.

24 Claims, 11 Drawing Sheets

OTHER PUBLICATIONS

Berry et al., "Control Of The Radio-Frequency Wave Form At The Chuck Of An Industrial Oxide-Etch Reactor," *J. Vac. Sci. Technol. A*, Nov./Dec. 2000, vol. 18, pp. 2806-2814.

Garvin et al., "Measurement And Error Evaluation Of Electrical Parameters At Plasma Relevant Frequencies And Impedances," *J. Vac. Sci. Technol. A*, Mar./Apr. 1998, vol. 16, pp. 1-11.

Hargis et al., "The Gaseous Electronics Conference Radio-Frequency Reference Cell: A Defined Parallel-Plate Radio-Frequency System For Experimental And Theoretical Studies Of Plasma-Processing Discharges," *Rev. Sci. Instrum.*, Jan. 1994, vol. 65, pp. 140-154.

Miller, et al., "Dynamics of Collisionless RF Plasma Sheaths," *J. Appl. Phys.*, Oct. 15, 1997, vol. 82, pp. 3689-3709.

Woodworth et al., "Ion Energy distributions At RF-Biased Wafer Surfaces," *J., Vac. Sci. Technol. A*, May/Jun. 2002, vol. 20, pp. 873-886.

Savas et al., "Dummy load technique for power efficiency estimate in rf discharges," *Review of Scientific Instruments*, vol. 57, No. 7 (Jul. 1986) pp. 1248-1250.

Notification of Transmittal of the International Search Report and the Written Opinion of the International Searching Authority, or the Declaration for PCT/US2004/005827, dated Nov. 26, 2004.

* cited by examiner

METHODS AND APPARATUS FOR CALIBRATION AND METROLOGY FOR AN INTEGRATED RF GENERATOR SYSTEM

RELATED APPLICATIONS

This application is a continuation of patent application Ser. No. 10/373,163, now U.S. Pat. No. 6,781,317, filed on Feb. 24, 2003, the entire disclosure of which is incorporated herein by reference.

FIELD OF THE INVENTION

The present invention relates generally to plasma processing equipment. In particular, the present invention relates to calibration and control of RF and microwave plasma processing equipment.

BACKGROUND

Radio frequency or microwave (hereinafter "RF") plasma generation equipment is widely used in semiconductor and industrial plasma processing. Plasma processing supports a wide variety of applications, including etching of materials from substrates, deposition of materials onto substrates, cleaning of substrate surfaces, and modification of substrate surfaces. The frequency and power levels employed vary widely, from about 10 kHz to 2.45 GHz and from a few Watts to as much as 100 kW or greater. For semiconductor processing applications, the range of frequencies and powers presently used in plasma processing equipment is somewhat narrower, ranging from about 10 KHz to 2.45 GHz and 10 W to 30 kW, respectively.

Plasma processing equipment typically requires a precision RF signal generator, a matching network, cabling, and metrology equipment. In addition, precision instrumentation is usually required to control the actual power reaching the plasma. The impedance of loads associated with a plasma can vary considerably in response to variations in gas recipe, plasma density, delivered RF power, pressure and other parameters.

An RF supply, including a signal generator and matching network, can deliver power to the plasma in a number of ways, for example, via an antenna or sample holder. An antenna typically has a primarily inductive load impedance, with a smaller resistive component. In contrast, a sample holder (a "chuck" or "bias") typically presents a primarily capacitive impedance, also with a smaller resistive component.

Matching networks are typically positioned between the output of the RF generator and the input of the process chamber. The matching network provides a means of matching the output impedance of the generator to the input impedance of the process chamber. A matching network often includes elements such as variable capacitors and variable inductors to permit dynamic impedance matching of an RF generator to a changing load.

Most RF generators for plasma processing equipment are designed to have a standard fifty-ohm output impedance. A matching network can accommodate mismatches in impedance between the standard fifty-ohm output impedance of the RF generator and the input of the load. The mismatch can be exacerbated by a process chamber and plasma whose associated load can fluctuate over a large range of values.

The impedance mismatch can cause inefficient power deliver. The mismatch can also cause the power delivered to the plasma to vary, which can cause process inconsistency both within a chamber for successive substrates and among similar chambers. Thus, use of an impedance matching network can improve the efficiency of power transfer from a signal generator to a plasma vessel.

Components used in some plasma generation systems can present further difficulties in process characterization and control. For example, many systems utilize coaxial cables to connect an RF generator to an impedance matching network.

Determination of the power delivered to a reactive load (i.e., as presented by the plasma vessel) can be difficult and of limited accuracy. A standard operating method entails holding power delivered to the plasma vessel load constant. The power, however, is generally not well known because, for example, power is lost in the matchbox; the lost power is a complicated function of, for example, the positions of the vacuum variable capacitors in a matchbox plus a plasma vessel load having a nonlinear behavior.

An impedance probe can be placed between the matchbox and the plasma vessel to obtain a measure of power delivered to the plasma vessel. This approach has at least two disadvantages. First, an impedance probe can be very inaccurate when the phase angle between current voltage waveforms is high. A high phase angle typically is encountered for a highly reactive plasma vessel load. Second, impedance probes are typically too costly for production systems.

SUMMARY

Various embodiments of the invention remedy many limitations encountered in measurement, calibration and control of prior art RF powered plasma systems. An RF plasma generation system, according to principles of the invention, can include an RF generator, impedance matching network, a signal probe that monitors the RF signal between the generator and the matching network, a plasma vessel, and a calibration database. The calibration database provides data that permits accurate determination, for example, of plasma vessel power consumption via RF signal parameter values collected by the signal probe. The calibration database is obtained from measurements collected from the impedance matching network and a calibration load that represents the behavior of the plasma vessel.

The system can provide accurate measurements of plasma vessel impedance and plasma vessel power consumption, even when the load associated with the plasma vessel is highly reactive. The system is particularly well suited to designs that include a variable frequency RF generator and an impedance matching network having an impedance that is fixed during operation of the system. In such a system, the frequency can be adjusted to obtain a minimum in reflected power.

Accordingly, in a first aspect, the invention features a method for operating an RF plasma generation system. The system can include an RF signal generator, an impedance matching network, a plasma vessel, and an RF signal probe that monitors the RF signal delivered from the RF signal generator to an input port of the impedance matching network.

The method includes causing an RF signal to be applied to the input port of the impedance matching network, monitoring a present value of at least one parameter of the RF signal associated with the input port of the impedance matching network, and causing the RF signal to be applied from an output port of the impedance matching network to an input port of the plasma vessel. The RF signal is monitored at a location along a pathway of the RF signal between the RF signal generator and the input port of the impedance matching network.

The method also includes providing calibration data associating values of the RF signal parameter with values of a characteristic of a load associated with the plasma vessel. A present value of the characteristic of the load associated with the present value of the parameter of the RF signal is determined by referencing the calibration data.

The impedance matching network has a fixed impedance. The impedance matching network can have a plurality of fixed impedances associated with a plurality of operating recipes of the RF plasma generation system.

In a second aspect, the invention features a method for calibrating an RF plasma generation system. The method includes providing a calibration load that represents the load associated with the plasma vessel. The calibration load has an input port in electromagnetic communication with an output port of the impedance matching network. A sequence of RF signals is applied to the input port of the impedance matching network thereby causing the sequence of RF signals to be applied to an input port of the calibration load. At least one parameter associated with the sequence of RF signals applied to the input port of the impedance matching network is determined, as is at least one characteristic of the calibration load responsive to the sequence of RF signals.

The power of the RF signals can be ramped over a range of power values associated with operation of the RF plasma generating system. A value of the impedance of the calibration load can be determined to characterize the calibration load, and the value of the impedance can be stored. At least one value of the impedance of the load, associated with a center frequency of the RF signal, a range of frequencies of the RF signal, and/or a range of temperatures of the calibration load, can be determined. The characteristic of the calibration load can be a power consumption of the calibration load.

In a third aspect, the invention features an RF plasma generation system. The system includes an impedance matching network having an input port to receive an RF signal from an RF generator, and an output port to deliver the RF signal to an input port of a plasma vessel associated with a load. The system includes an RF signal probe in electromagnetic communication with the input port of the impedance matching network to detect at least one RF signal parameter associated with the RF signal at the input port of the impedance matching network.

The system also includes a calibration storage unit. The unit stores calibration data that includes an association of values of the RF signal parameter with values of at least one characteristic of the load. A control unit determines an association between the detected signal parameter and a present value of the plasma vessel load characteristic by referencing the calibration data.

In a fourth aspect, the invention features an RF plasma generation system. The system includes an impedance matching network, a plasma vessel associated with a load, and a data storage unit storing calibration data.

The calibration data is created by a method that includes providing a calibration load that represents the load associated with the plasma vessel. The calibration load has an input port in electromagnetic communication with an output port of the impedance matching network. The method includes applying a sequence of RF signals to the input port of the impedance matching network, determining at least one parameter associated with the sequence of RF signals applied to the input port of the impedance matching network, and determining at least one characteristic of the calibration load responsive to the sequence of RF signals.

BRIEF DESCRIPTION OF THE DRAWINGS

The above and further advantages of this invention may be better understood by referring to the following description in conjunction with the accompanying drawings, in which like numerals indicate like structural elements and features in various figures. The drawings are not necessarily to scale, emphasis instead being placed upon illustrating the principles of the invention.

DETAILED DESCRIPTION

Figure 1:
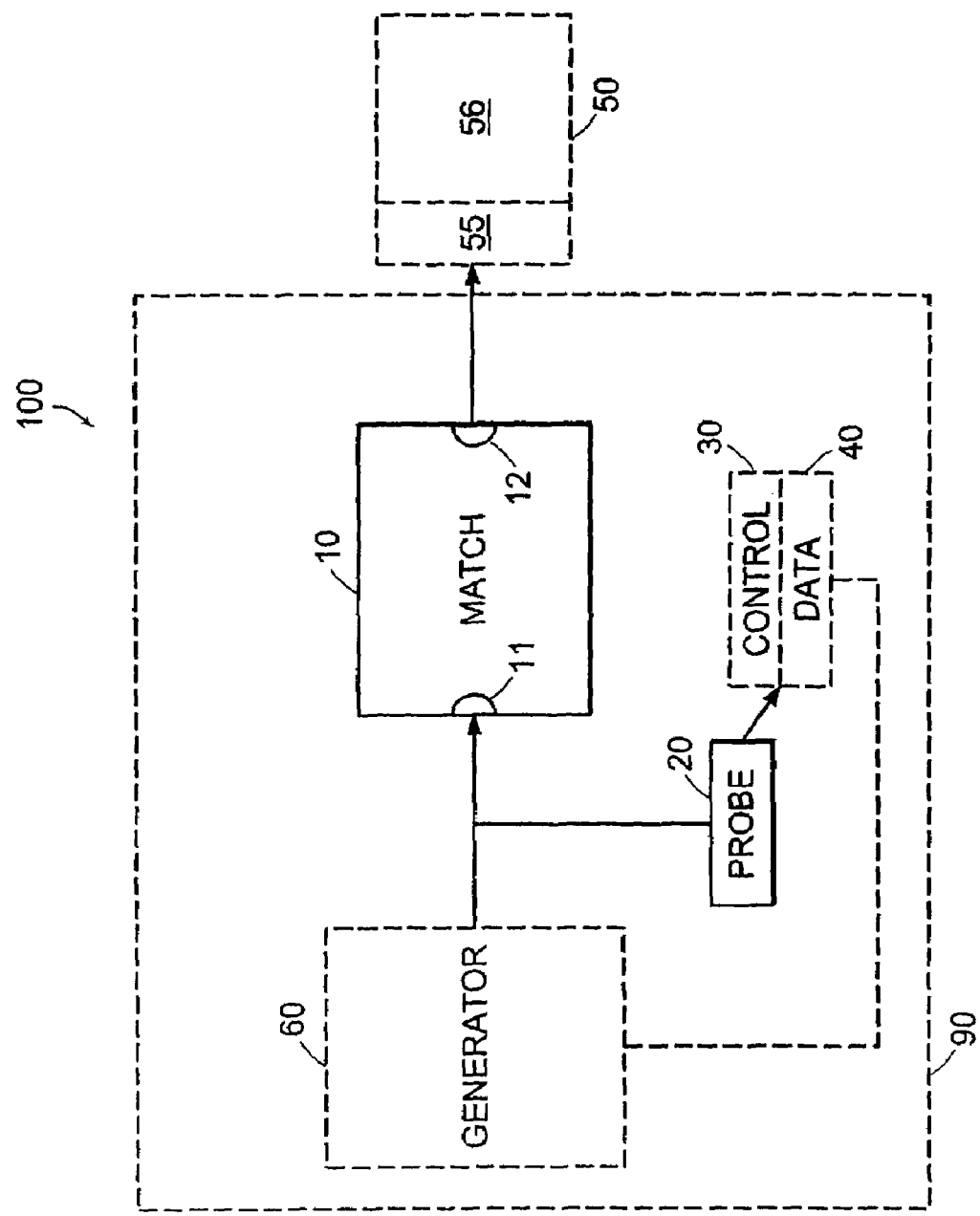
FIG. 1 is a block diagram of an embodiment of an RF plasma generation system.

An "RF signal", as used herein, refers to an electromagnetic field or a collection of moving charged particles having a frequency in the RF or microwave range. As used herein, an RF generator produces an RF signal for delivery, for example, to a matching network. After transforming the RF signal, the network can provide the RF signal for delivery to a plasma vessel.

A "plasma vessel" includes at least one RF delivery component and has at least one chamber within which a plasma can exist.

An "RF delivery component" can deliver power to a plasma in a chamber of a plasma vessel. The RF delivery component can be, for example, a chuck and/or a coil.

A "coil" is a predominately inductive antenna component of a plasma vessel, which delivers power to a plasma within the vessel.

A "chuck" or "bias" is a predominately capacitive component of a plasma vessel, which delivers RF power to a plasma within the vessel. A chuck or bias can be a sample substrate holder.

A "load" is, or relates to, a component or portion of a plasma system that consumes power (for example, a plasma vessel load). A load can be characterized by an impedance associated with the load. Information about the impedance can assist in determination of the power consumed by the load.

A "plasma vessel load" (also referred to as a load or impedance associated with a plasma vessel) is primarily a combination of the load associated with the RF delivery component of the plasma vessel and the load associated with the plasma within the plasma vessel.

A "probe" is a device that can monitor one or more parameters of an RF signal (e.g., a voltage, current and/or phase of the RF signal). A probe can function by being placed, for example, in series or parallel with other components of a plasma system or via other means. A probe can be any type of electromagnetic sensor, such as sensors that measure forward or reflected RF voltage, current, power, and/or phase.

"Reactance" is a portion of the impedance of an alternating-current circuit that is associated with a capacitance and/or inductance, and which typically is expressed in units of ohms.

The terms "parameter" and "characteristic" are herein used interchangeably to refer to quantifiable aspects of an RF signal or a plasma. The term "value" is herein used to refer to a quantitative measure of a parameter or characteristic. The terms "monitor", "detect" and "measure" herein interchangeably refer to the collection and/or quantification of parameters and characteristics.

The terms "calibration" and "calibrate" herein interchangeably refer to measurements and processing of measurements performed to provide improved accuracy and/or precision of available data relating to component characteristics and operating conditions of plasma generation apparatus.

The terms "resonant frequency" and "off-resonant frequency" respectively refer to operating frequencies that lead to resonant and off-resonant operation.

The term "resonant operation" refers to RF power delivery when RF current and RF voltage are approximately in-phase at an input to a matching network. The term "off-resonant operation" refers to RF power delivery when current and voltage are not in phase.

In electromagnetic transmission line theory, the reflection coefficient ("Γ") refers to the ratio of the reflected electric wave amplitude to the forward wave amplitude.

FIG. 1 illustrates an embodiment of an RF plasma generation system 100. The system 100 includes power supply portion 90 and a plasma vessel 50. The plasma vessel 50 has at least one chamber 56 and an RF delivery component 55, which can deliver power to a plasma in the chamber 56. The RF delivery component 55 includes, for example, a coil or a chuck. The power supply portion 90 includes an impedance matching network 10 and an RF signal probe 20, and can include an RF generator signal 60. The RF signal generator 60 generates an RF signal for delivery to an input port 11 of the impedance matching network 10. The impedance matching network 10 also has an output port 12 for delivery of the RF signal, either directly or via intermediate components, to the RF delivery component 55 of the plasma vessel 50.

The probe 20 detects one or more characteristics associated with the RF signal delivered to the input port 11 of the impedance matching network 10. The probe 20 can be positioned, for example, in series or parallel relative to an electromagnetic connection between the RF signal generator 60 and the impedance matching network 10.

The system 100 can also include a control unit 30, and can include a calibration data unit 40. The control unit 30 can be in communication with the RF signal generator 60, to provide control signals to the RF signal generator 60, and can be in communication with the probe 20, to receive data from the probe regarding the one or more characteristics associated with the RF signal delivered to the input port 11 of the impedance matching network 10.

The calibration data unit 40 stores calibration data related to the behavior of the impedance matching network 10 and the plasma vessel (production of calibration data is described below with reference to FIG. 5 through FIG. 8). The calibration data is obtained and stored prior to operation of the system 100. Relatively precise measurements of system performance and control of system 100 are possible via collection of RF signal data by the probe 20, and by associations of the data with calibration data, as performed manually by an operator or automatically by the control unit 30.

The impedance matching network 10 has a fixed impedance during operation of the system 100. A fixed impedance can permit data collected by the probe 20 to accurately indicate characteristics of the plasma vessel 55 load, via associations provided by the calibration data. The impedance matching network 10 can include one or more components that each have a fixed impedance, or can be configurable to provide a desired fixed impedance, for example, a particular impedance appropriate for a specific processing recipe to be implemented by the system 100. In a preferred embodiment, the impedance matching network 10 does not include variable-impedance components such as motor-driven vacuum capacitors or other components that can introduce undesirable instability.

The term "fixed", as used herein, refers to an impedance that is not adjusted during operation of the system for a particular recipe. The impedance matching network 10, however, can be reconfigured with a different fixed impedance to support a different operational recipe.

Fixed values of a fixed impedance matching circuit can be manufactured with tolerances, for example, in a range of 1 to 2%. Variations in reactive elements can be accommodated, for example, by allowing the center frequency to vary or by adding small compensating elements, for example, capacitors. Variation in the resistance ("Q") of the matching elements can change the overall system efficiency, but the system 100 can be implemented with sufficient "headroom" (i.e., additional power capability) to accommodate such a variation.

Generally, the RF delivery component 55 can include multiple components. For example, the RF delivery component 55 can include complicated mechanical structures whose electrical characteristics can be modeled as a network of inductors, resistors and capacitors.

The calibration data can include data that relates values of impedance associated with the load of the plasma vessel 50 with values of parameters that can be measured by the probe 20. The calibration data can also include data that relates values of the parameters to a power delivery efficiency. The power delivery efficiency can be defined as the ratio of the power delivered to the load associated with the plasma vessel 50 to the power of the RF signal associated with the input 11 of the network 10 (as can be measured via the probe 20).

During operation of the system 100, the load impedance and the power delivery efficiency of the impedance matching network 10 can then be accurately determined from measurements of the RF signal prior to entry at the input 11 of the impedance matching network 10 by referencing data in the calibration database. The measured power of the RF signal prior to entry at the input 11 in combination with the power delivery efficiency then provides an accurate determination of the power delivered to the load associated with the plasma vessel 50. Knowledge of the plasma vessel 50 impedance and power consumption can in turn be utilized for intelligent control of the system 100.

In a preferred embodiment, the RF signal generator 60 is a variable frequency generator, and the impedance matching network 10 has a fixed impedance, or a plurality of fixed impedances corresponding to, for example, a plurality of operational recipes. For example, the network 10 can include selectable components to provide a fixed impedance in response to the selection of one of an operational recipe.

The control unit 30 can be implemented in software, firmware or hardware (e.g., as an application-specific integrated circuit), and can include a user interface. The control unit 30 can be implemented, for example, as one or more integrated circuits, such as microprocessors. A single integrated circuit or microprocessor can include the control unit 30 and the calibration data unit 40. One or more microprocessors can implement software that enables the functioning of the control unit 30. The software can be designed to run on general-purpose equipment or specialized processors dedicated to the functionality herein described.

The system 100 can include a user interface to provide interaction with the control unit 30 and/or other portions of the system 100. The interface can be configured to accept control information from a user and to provide information about the system 100 to a user. The user interface can be used, for example, to set system control parameters or to provide diagnostics and troubleshooting information to the user. In one embodiment, the user interface provides networked communication between the system 100 and users that may be either local to the operating environment or remote from the operating environment. The user interface can also be used to modify and update software.

Figure 2:
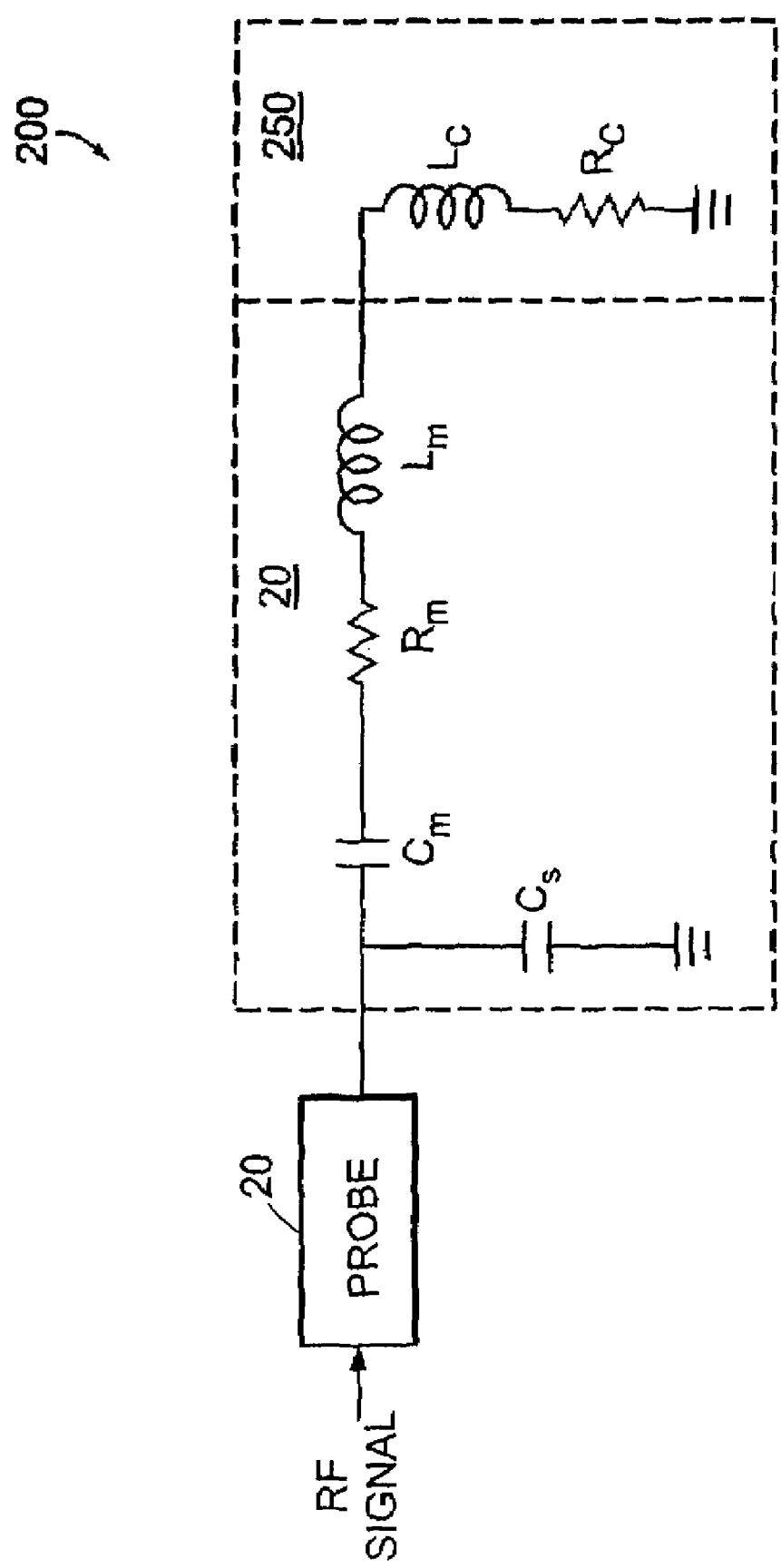
FIG. 2 is an embodiment of an equivalent circuit diagram, which is associated with the matching network and the plasma vessel of FIG. 1.

The behavior of the system 100 can be illustrated with reference to an equivalent circuit diagram. FIG. 2 is an equivalent circuit diagram 200, which includes equivalent circuit components that can be associated with the actual components of the matching network 10 and the plasma vessel 50. The equivalent circuit diagram 200 includes a matching network portion 210 and a plasma vessel portion 250. The matching network portion 210 includes a capacitive component $C_m$, a resistive component $R_m$, an inductive component $L_m$, and/or a shunt capacitive component $C_s$. These components can illustrate the origins of the impedance of the impedance matching network 10.

The plasma vessel portion 250 includes a resistive component $R_c$ and/or an inductive component $L_c$. These components can illustrate the origins of the impedance associated with the plasma vessel 50. For example, an RF delivery portion that includes a coil can contribute to the inductive component $L_c$ of the plasma vessel portion 250 of the circuit diagram 200, while a plasma within the plasma vessel can contribute to the resistive component $R_c$. Alternative equivalent circuit diagrams can include an capacitive component to, for example, include a contribution to impedance from a chuck.

Figure 3:
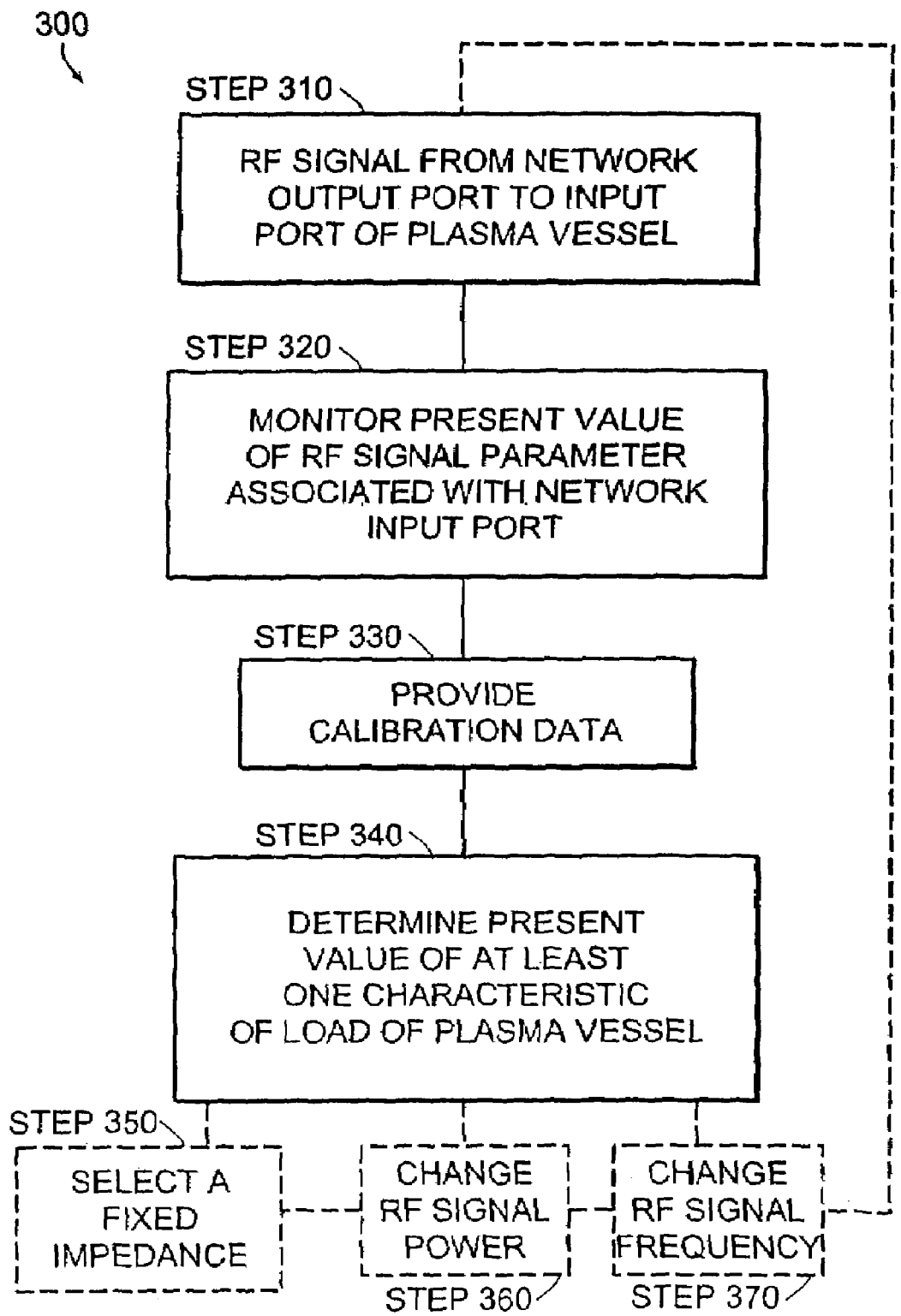
FIG. 3 is a flowchart of an embodiment of a method for operating an RF plasma generation system.

FIG. 3 illustrates a flowchart of an embodiment of a method 300 for operating a plasma generation system. The method 300 can be implemented, for example, by the above-described RF plasma generation system 100. Where the following description, for clarity, refers to components of the RF plasma generation system 100, the references should not be considered as limiting the method 300 to implementation with the RF plasma generation system 100.

The method 300 includes causing an RF signal to be applied from an output port of an impedance matching network to an input port of a plasma vessel associated with a load (Step 310), monitoring a present value of at least one parameter of the RF signal associated with an input port of the impedance matching network (Step 320), providing calibration data associating values of the at least one RF signal parameter with values of at least one characteristic of the load (Step 330), and determining a present value of the at least one characteristic of the load associated with the present value of the at least one parameter of the RF signal by referencing the calibration data (Step 340).

The one or more parameters of the RF signal can include, for example, a voltage, a current, a phase, and/or a power of the RF signal. The at least one characteristic of the load can include, for example, a power delivered to the load and/or an impedance of the load.

The method 300 can further include selecting a fixed impedance of the impedance matching network (Step 350). The impedance matching network preferably has a fixed impedance during operation of the system 100. An appropriate impedance can be selected, for example, to support a particular process recipe.

The method can include changing a power of the RF signal associated with the input port of the impedance matching network if the present value of the characteristic of the load is different than at least one predetermined load criterion (Step 360). For example, the predetermined load criterion can be a power level delivered to the load associated with the plasma vessel 50.

The method can further include adjusting a frequency of the RF signal responsive to the determination of the present value of the characteristic of the load (Step 370). The frequency of the RF signal can be adjusted to an off-resonant frequency. In general, a desirable frequency can be either below or above the resonant frequency. The frequency can be adjusted to reduce or minimize power reflected from the impedance matching network 10 towards the RF signal generator 60, or to reduce or minimize plasma fluctuations and instabilities.

The RF plasma generation system 100 can be implemented, for example, as a closely-coupled system. A closely-coupled plasma system has an RF signal generator and matching network portions that are in close proximity, for example, in a single housing, without use of a connecting coaxial cable. The housing can be attached directly to a plasma vessel, and have the output of the matching network coupled to the plasma vessel without use of a coaxial cable. A closely coupled plasma system can reduce errors in measurement and control that arise from use of coaxial connector cables. Such a system can also be calibrated as a single unit, which reduces error in comparison to combinations of calibrations of individual components.

The calibration data can include, for example, associations of parameter values to load characteristic values, for example, associations of current values to load impedance values, and other associations, such as parameter values to power delivery efficiency values. In a preferred embodiment, power delivery efficiency values are associated with, and dependent on, both load impedance values and RF signal power values.

The associations can be stored, in part, as a power delivery efficiency table. The power delivery efficiency table includes ratios of power delivered to the calibration load to power delivered to the input port of the impedance matching network. The ratios can be tabulated according to load impedance value and RF signal power value.

It can be convenient to formulate the power delivery efficiency table to include efficiency ratios as a function of a reflection coefficient ("Γ"). Γ, as known to one having ordinary skill in the RF power generator art, relates forward and reflected portions of an RF signal. As used herein, Γ relates to the RF signal that travels between the RF generator 60 and the input port 11 of the impedance matching network 10.

Since Γ is a complex number, it can be convenient to express efficiency ratios as a function of a signed magnitude of Γ values, where the signed magnitude of Γ is the magnitude of Γ multiplied by the sign of the cosine of the angle of Γ. For simplicity, the signed magnitude of Γ is herein after generally referred to informally as the "reflection coefficient".

The calibration data also can include plasma vessel load impedance values as a function of the reflection coefficient. The calibration data can include one or more tables correlating load resistance values to reflection coefficient values. Alternatively, the resistance values can be calculated from an equation having parameters fitted to data points collected with a calibration apparatus (a calibration apparatus is described below, with reference to FIG. 5 through FIG. 8).

FIG. 4 illustrates a graph of a curve that relates load resistance values to reflection coefficient values. The curve was obtained by fitting a theoretically based equation to four data points determined through use of a calibration apparatus. The equation was derived from the following theoretical relationship between Γ and the resistance of the plasma vessel load, "RL":

$$|\Gamma|^2 = \frac{1 - 2r + r^2}{1 + 2r + r^2};$$ (equation 1)

$$r = Z_o / A(R_L + R_M),$$ (equation 2)

where $Z_0$ is a characteristic output impedance of an RF signal generator (12.5 ohms for the graph of FIG. 4a), and A and $R_M$ respectively are matching network transformation ratio and loss values. The curve in FIG. 4a was developed by solving Equations 1 and 2 for $R_L$ and adjusting A and $R_M$ to provide a least squares fit of the curve to the four data points.

Figure 4A:
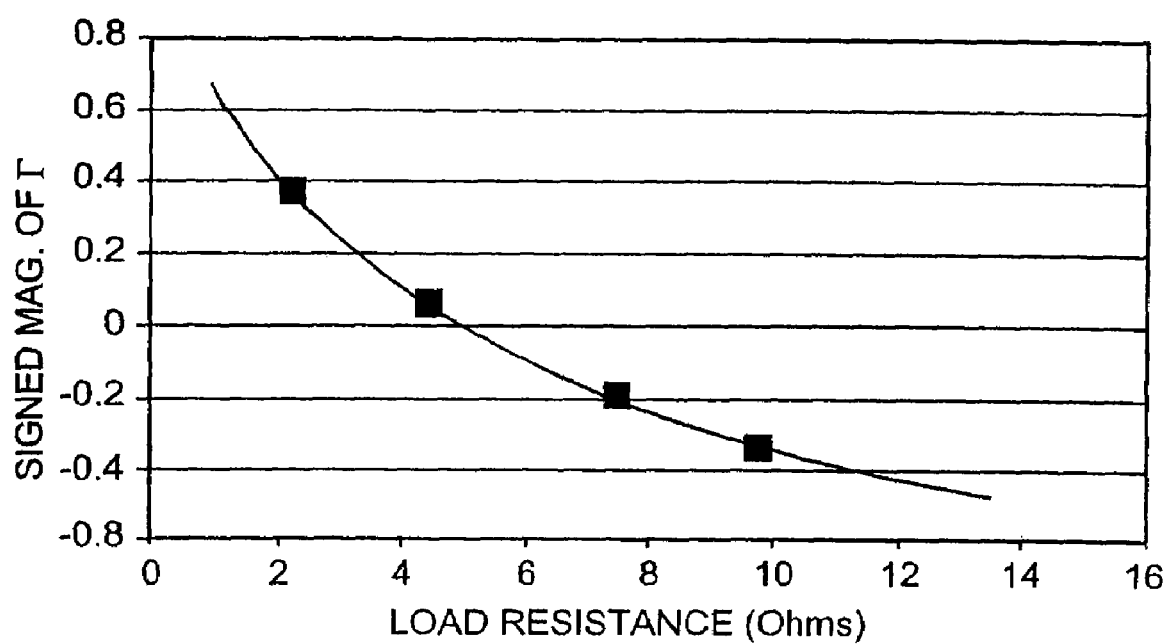
FIG. 4A is a graph of a curve that relates load resistance values to reflection coefficient values for one operational embodiment of an RF plasma generation system.

Alternatively, curves like that shown in FIG. 4a can be developed entirely empirically developed, for example, by collecting more data point with the calibration apparatus.

During operation of the system 100, the reflection coefficient can be determined via the probe 20, and the plasma vessel impedance than determined via reference to tabulated calibration data, or calibration data in the form of an entirely or partially empirically-based equation.

Once the plasma vessel impedance is determined, the power delivery efficiency can be determined because the power delivery efficiency is generally a function of both the plasma vessel load impedance and the power determined via the probe 20 (i.e., the power delivered to the input port 11 of the impedance matching network 10). The power delivered to the plasma vessel can then be determined by multiplying the power determined by the probe 20 by the power delivery efficiency. Alternatively, delivered power values can be stored, as a function of the above-described quantities. Power delivery efficiency can be included in the calibration data, for example, in table form.

Figure 4B:
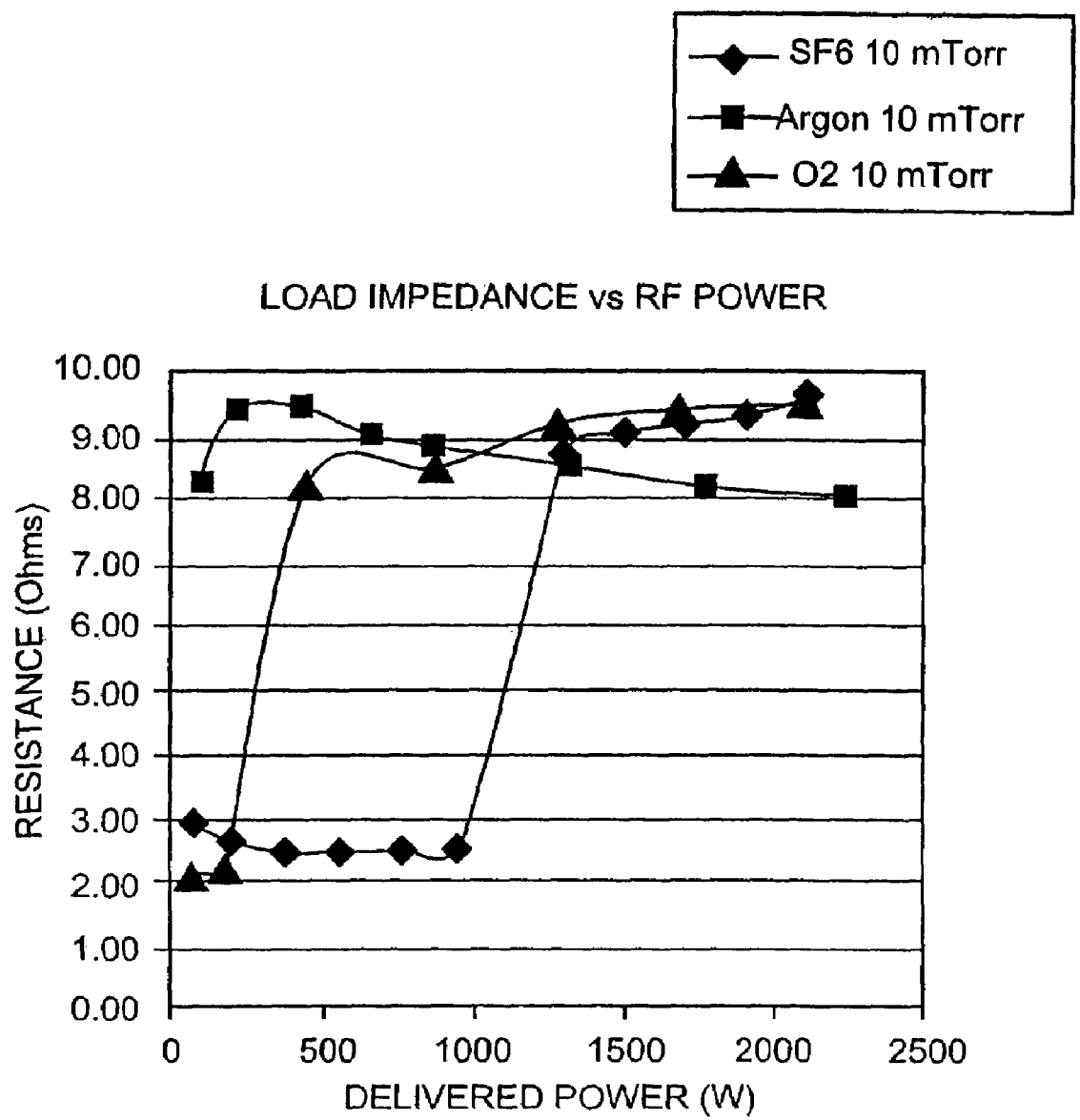
FIGS. 4b, 4c and 4d are graphs of exemplary calibration data, which illustrate specific operational recipes for an embodiment of an RF plasma generation system.
Figure 4C:
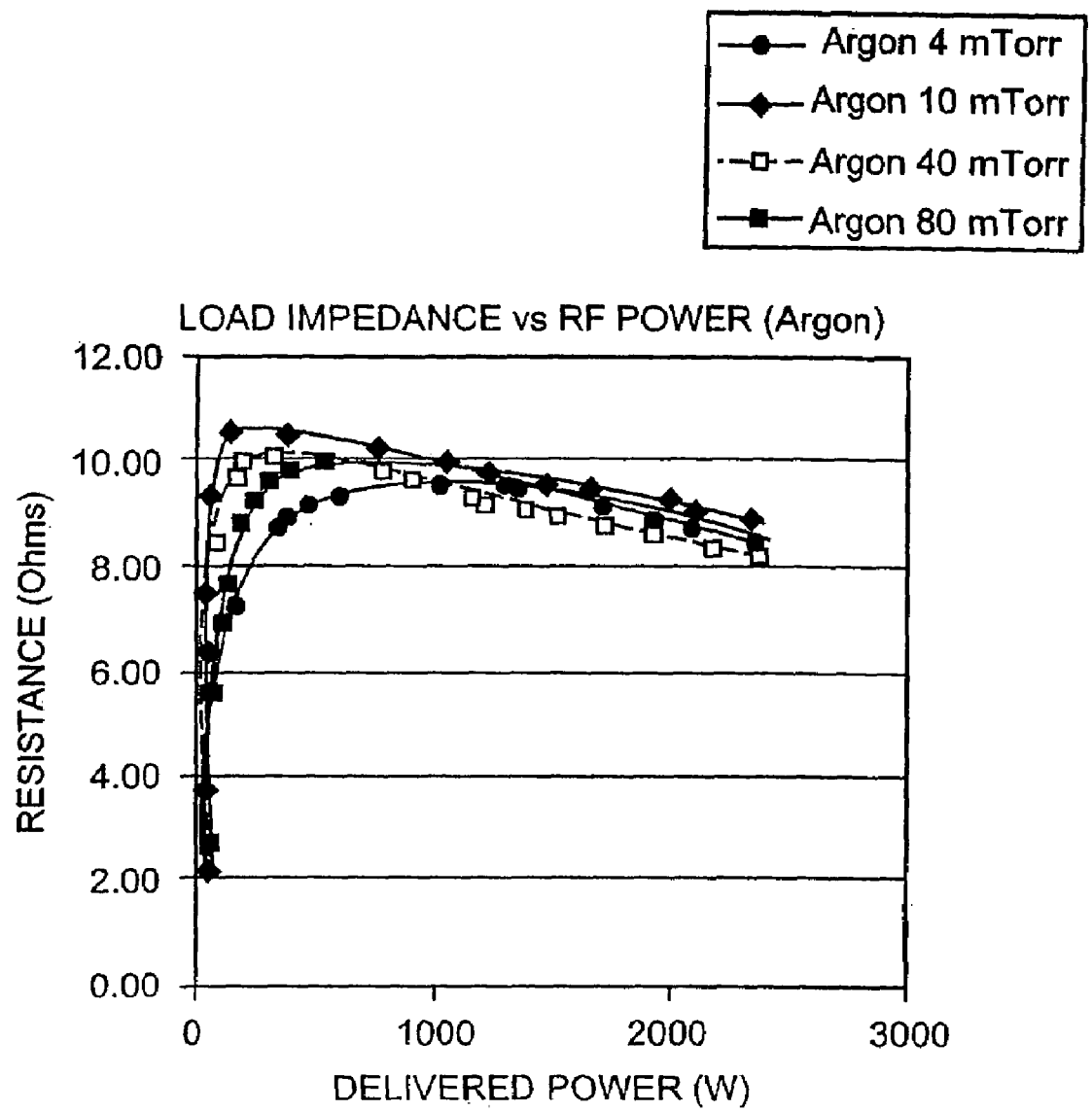
Figure 4D:
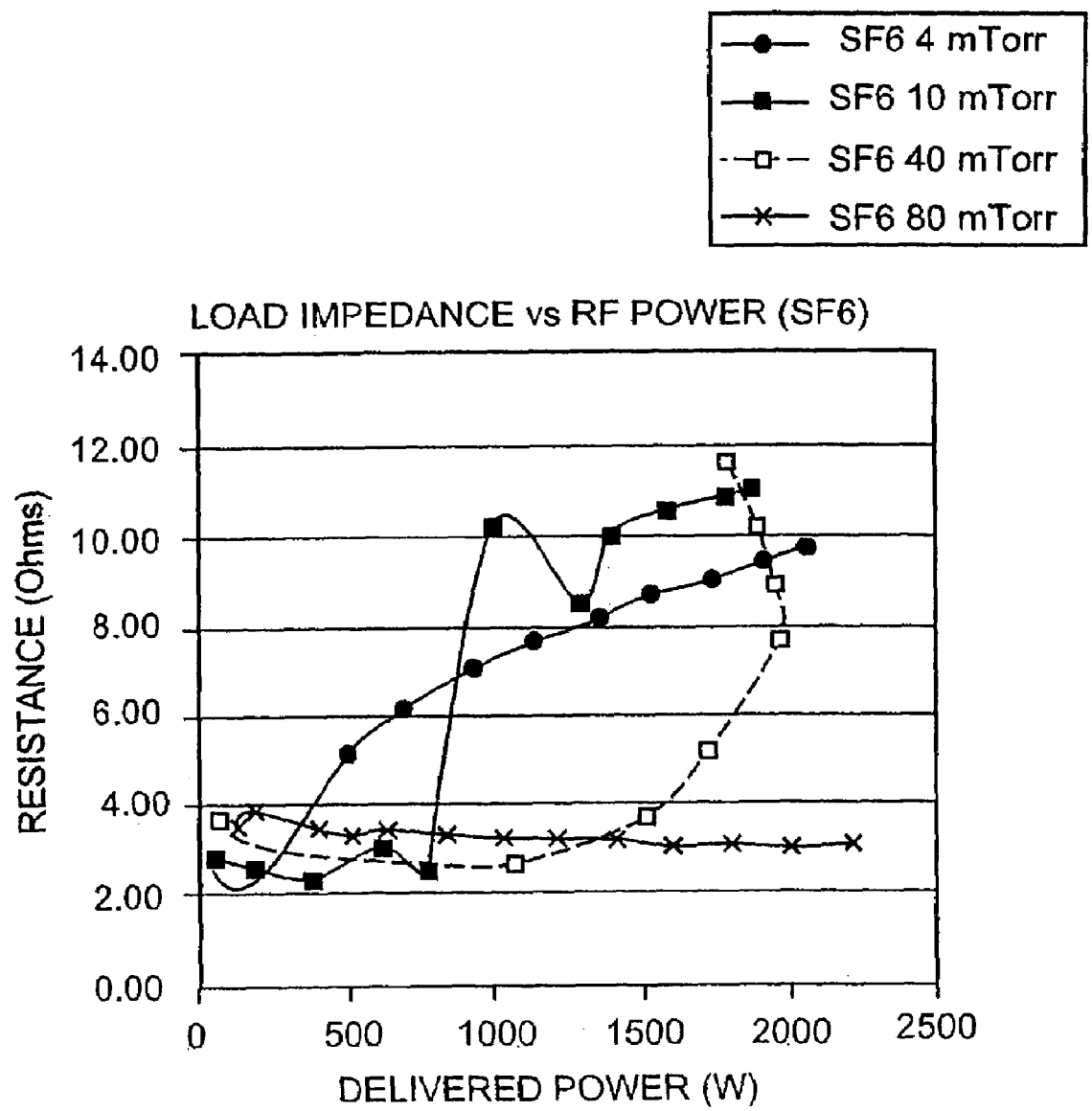

FIGS. 4b, 4c and 4d are graphs of some embodiments of portions of calibration data, which illustrate some specific operational recipes for a system 100. FIG. 4b shows three curves of load impedance versus delivered power, each for a different gas species (Ar, $O_2$ and $SF_6$) from which a plasma is formed. FIG. 4c shows four curves of load impedance versus delivered power, each for an argon-based plasma at four different pressures. FIG. 4d similarly shows four curves of load impedance versus delivered power for an $SF_6$-based plasma, at four different pressures.

Figure 5:
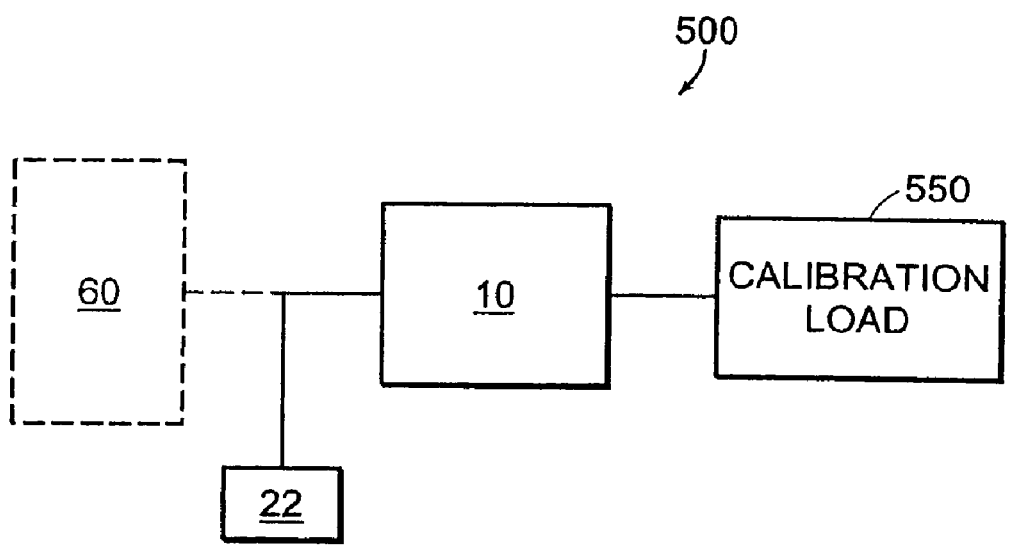
FIG. 5 is a block diagram of an embodiment of a calibration apparatus.

FIG. 5 is a block diagram that illustrates an embodiment of a calibration apparatus 500 that can be used to calibrate the RF plasma generation system 100. The apparatus preferably includes the probe 20 and the impedance matching network 10, as well as a calibration load 550. The calibration load 550 is designed to represent the behavior of the plasma vessel 50. An RF signal can be supplied to the calibration apparatus 500 from the RF signal generator 60 or any generator that can provide, for example, a desired range of RF signal frequencies and power levels.

Use of the calibration load 550 permits, in part, calibration of data extracted from the probe 20. Measurements collected with the probe 20 and impedance matching network 10 connected to the calibration load 550 permit calibration of data extracted from the RF signal via the probe 20. That is, calibration data is developed from probe 20 measurement data collected with the calibration apparatus 500. The calibration data then supports measurements of improved accuracy when the probe 20 and the impedance matching network are utilized as part of the RF plasma generation system 100. More generally, calibration data can be developed using a probe and a network that represents the behavior and/or structure of the probe 20 and the impedance matching network 10.

The calibration load 550 includes one or more components that permit it to represent the behavior of the load associated with the plasma vessel 50. For example, the calibration load 550 can include one or more resistors, inductors and/or capacitors to provide an impedance that is effectively the same as an impedance of the plasma vessel 50.

Generally, the impedance of the plasma vessel 50 is a function of several factors. These factors can include the structure of the RF delivery component 55 (e.g., a coil or a chuck) and plasma factors such as the atomic species, density, pressure and power absorption of the plasma. The impedance arising from these factors can be represented with, for example, a collection of one or more of the above-described electronic components.

In practice, the calibration load 550 provides a known load for calibration of data extracted from the RF signal obtained via the probe 20. Thus, RF signal parameters collected from the probe 20 can be evaluated while operating the calibration apparatus 500 with a well-characterized calibration load 550 connected to the output 12 of the impedance matching network 10. The calibration load 550 acts as a stand-in for the plasma vessel 50 because the load of the plasma vessel 50 is generally poorly known. Calibration data developed through use of the calibration apparatus 500 then permits, as described above, interpretation of data collected via the signal probe 20 to accurately characterize the load associated with the plasma vessel 50 (for example, load impedance or load power consumption).

Figure 6:
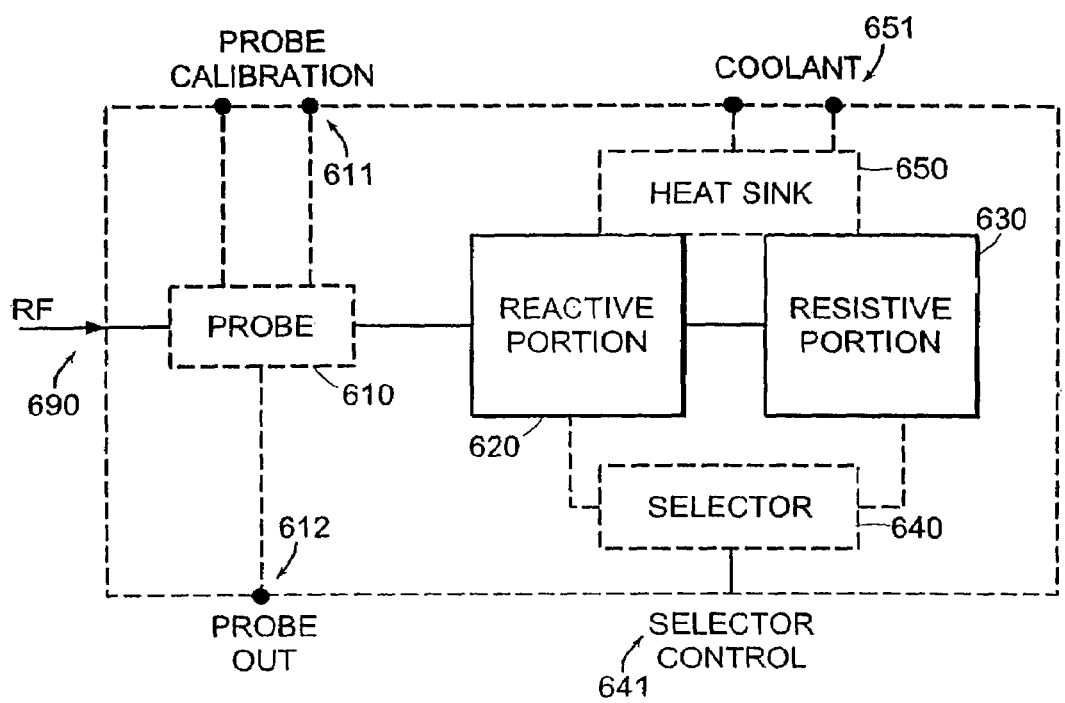
FIG. 6 is a block diagram of an embodiment of a calibration load.

FIG. 6 illustrates a block diagram of a more detailed embodiment of a calibration load 550a. The calibration load 550a includes a reactive portion 620, a resistive portion 630, a probe 610 and an RF signal input port 690. The reactive portion 620, resistive portion 630, and probe 610 are in electromagnetic communication with the RF signal input port 690. An RF signal received via the input port 690 passes through the reactive portion 620 and the resistive portion 630. The probe 610 detects at least one characteristic of the RF signal that is received via the input port 690. A primary use of the probe 610 can be determination of power consumption by the calibration load 550a.

The calibration load 550a can include a heat sink 650 to provide cooling of the reactive and/or resistive portions 620, 630. Coolant ports 651 can be included in the calibration load 550a to provide, for example, circulation of a liquid coolant through the heat sink 650. The heat sink 650 can include, for example, an alumina nitride ceramic substrate.

Probe calibration ports 611 can be provided for probe 610 calibration purposes, as discussed in more detail below. A probe output port 612 can be included to access an output signal of the probe 610 to monitor the at least one characteristic of the RF signal detected by the probe 610. The reactive portion 620 can have a selectable value of reactance and/or the resistive portion 630 can have a selectable value of resistance, which can be selected, for example, via a selector 640.

The selector 640 can include, for example, vacuum relays. A selector control port 641 can be included to provide control signals to the selector 640. The reactive portion 620 can include, for example, a spiral inductor. The resistive portion 630 can include, for example, selectable resistors. The spiral inductor and the selectable resistors can be mounted on a circuit board.

The RF signal input port 690 can include a high-power non-50 ohm connector. The probe 610 can include a transformer and a circuit board, which converts an alternating current (AC) signal into a direct current (DC) signal that is, for example, proportional to the root-mean-square (RMS) value of the RF signal detected by the probe 610. The circuit board can then deliver the DC signal to the probe output port 612. The probe 610 can thus detect, for example, the current of the RF signal received at the RF signal input port 690.

The reactive and resistive portions 620, 630 of the calibration load 550a can be selected to represent a load associated respectively with an RF delivery portion 55 and a plasma portion of the plasma vessel 50. More specifically, the reactive and resistive portions 620, 630 of the calibration load 550a are typically selected to provide a capacitive or inductive portion of impedance, primarily associated respectively with a chuck or a coil, and a resistive portion of impedance, primarily associated respectively with a plasma within the plasma vessel 50.

For example, the resistive portion 630 can include more than one resistor, and/or the reactive portion 620 can include one or more inductors and/or one or more capacitors. Various combinations of the selectable components can then be selected to provide a range of impedance values of interest. The range of values can be selected, for example, to correspond to an expected range of impedance values of the plasma vessel 50. It should be noted that the description herein of various components is somewhat idealized, i.e., real inductors, for example, generally contribute some resistance to a circuit.

The load of the plasma vessel 50, in turn, can be related to the impedance of fixed components, such as a coil or chuck of the RF delivery portion 55, and to a variable portion that is dependent on a particular process recipe or operating conditions of the vessel 50. For example, the load associated with a plasma can be a function of parameters that include the plasma density, chemical species, pressure, gas flow rate and power consumption.

Accordingly, the calibration load 550a can include a selector 540, which can select a fixed impedance of the reactive portion 620 and the resistive portion 630 to represent a particular operating condition of the plasma vessel 50. The calibration apparatus 500 can then be used to, in effect, calibrate the combination of the impedance matching network 10 and the plasma vessel 50 for the particular operating conditions. Calibration measurements can be obtained for a range of operating conditions. For example, a range of conditions that covers the range of operating conditions planned for the RF plasma generation system 100 can be surveyed.

RF signal characteristics detected by the probe 610 can provide a measure of the power consumption of the calibration load 550. Alternatively, calorimetry measurements, for example, can provide a measure of the power consumption of the calibration load 550.

In a preferred embodiment, the calibration load 550a is itself calibrated prior to collection of calibration data with the calibration load 550a. Calibration of the calibration load 550a can improve precision and/or accuracy of calibration data developed through use of the calibration load 550a. In particular, the utility of the calibration load 550a is improved if the output of the signal probe 20 is calibrated and/or the impedance of the reactive and resistive portions 620, 630 are know with accuracy and precision.

Figure 7A:
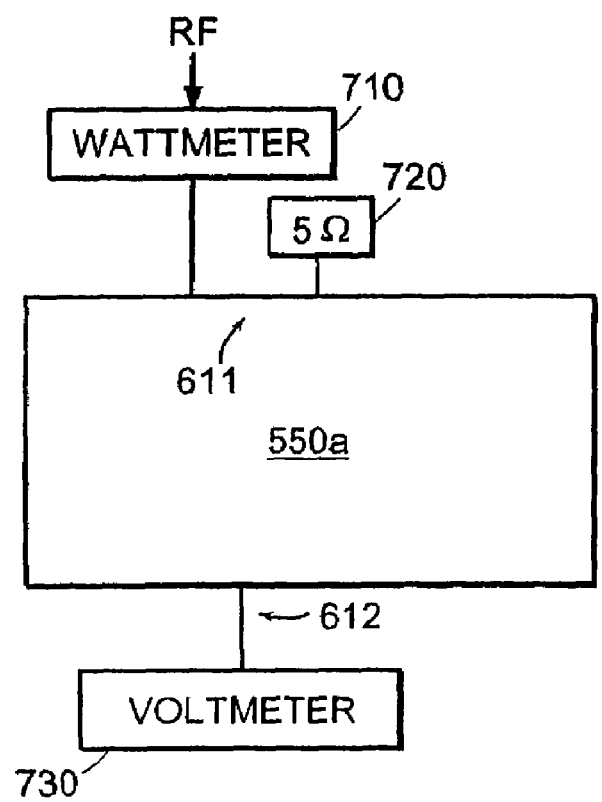
FIGS. 7a and 7b are block diagrams of embodiments of calibration apparatus for calibrating a calibration load.
Figure 7B:
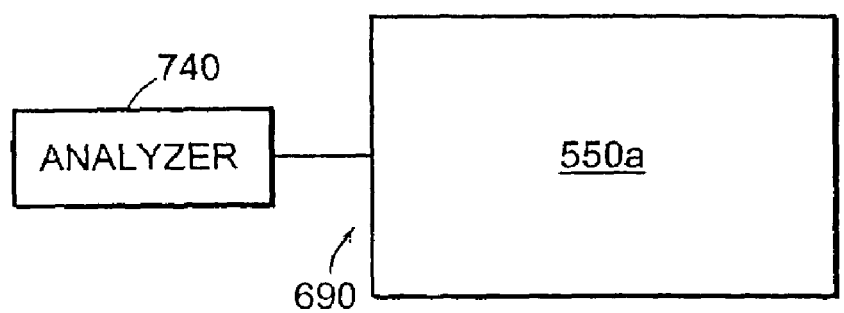

FIGS. 7a and 7b are block diagrams of embodiments of apparatus that can be used for calibrating the calibration load 550a. FIG. 7a illustrates calibration of the response of the probe 20, which in this illustrative embodiment is a current probe. The apparatus used to calibrate the calibration load 550a includes a wattmeter 70 and a 50 ohm standard load 720 connected to the probe calibration ports 611, and a voltmeter 730 connected to the probe output port 612. The wattmeter 70, 50 ohm standard load 720, and the voltmeter 730 are preferably calibrated with reference to a traceable standard, for example, National Institutes of Standards and Technology (NIST) standards. Their accuracy is preferably approximately 1% or better.

FIG. 7b illustrates calibration of the resistance of the reactive portion 620 and the resistive portion 630. An analyzer 740, connected to the RF signal input port 690 provides accurate measurements of the impedance associated with the calibration load 550a, that is, the impedance arising essentially from the reactive portion 620 and the resistive portion 630. For example, the analyzer 740 can be a network analyzer, as known to one having ordinary skill in the plasma processing equipment art. A desirable network analyzer preferably has a measurement accuracy of approximately 0.020 ohm or better. The network analyzer 740 can be used to provide measurements of the impedance of the calibration load 550a for all selectable combinations of the reactive portion 620, the resistive portion 630 and the temperature of the calibration load 550a. The resistive portion 630 of the calibration load 550a can also be determined, for example, from a measurement of the RF current via a probe in combination with a calorimetry measurement of the delivered power.

The impedance for each selectable combination can be measured at a center frequency of an RF signal. Alternatively, the impedance can be measured as a function of frequency, which can provide improved accuracy though generally requiring storage of more data. The calibration load 550a can change resistance as heat production causes a change in its temperature. The resistance change can be tracked to maintain valid calibration data. Alternatively, use of calorimetry obviates a need to track resistance changes.

Figure 8:
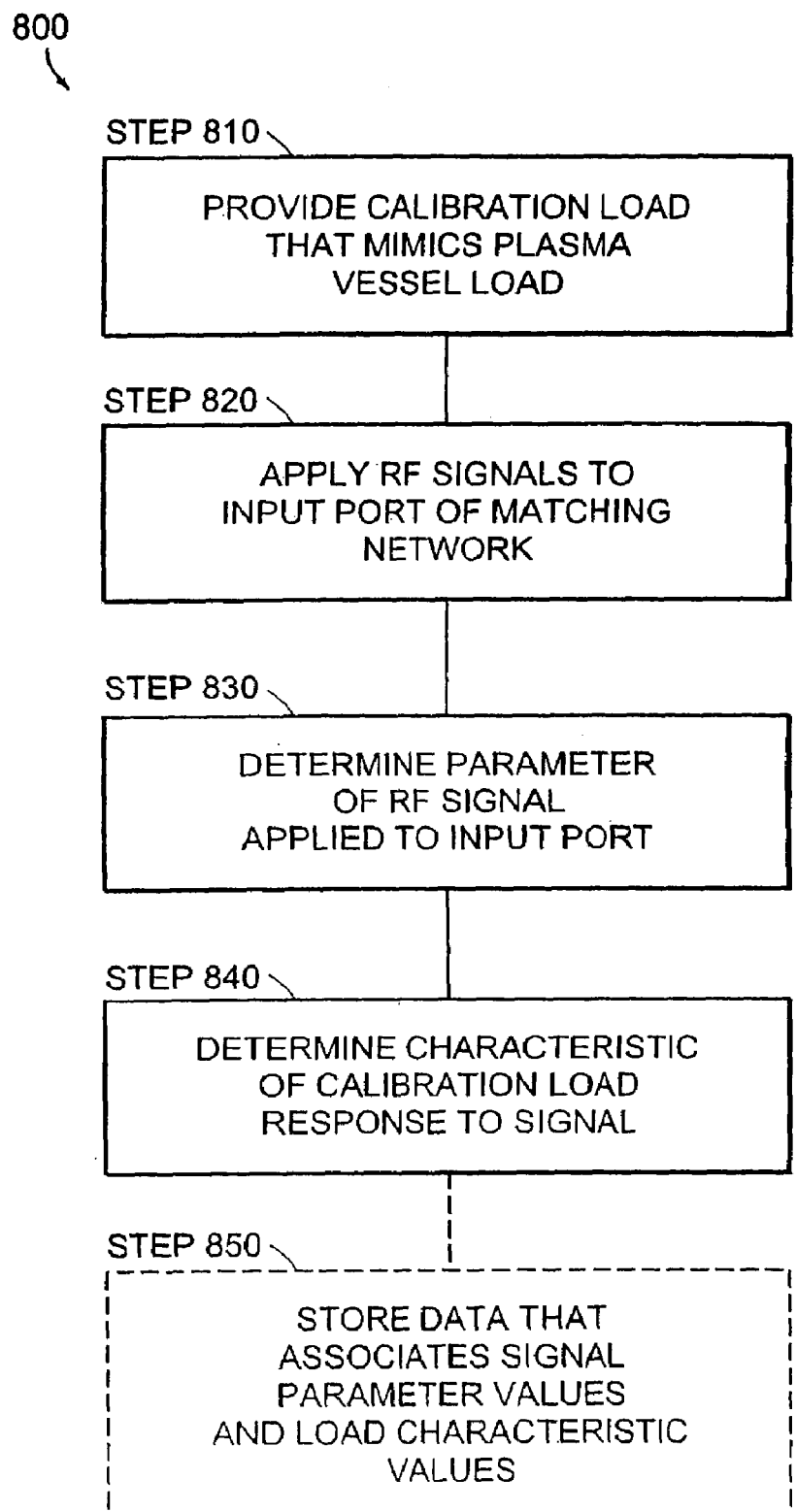
FIG. 8 is a flowchart of an embodiment of a method for calibration of an RF plasma generation system.

FIG. 8 illustrates a flowchart of an embodiment of a method 800 for calibration of an RF plasma generation system. The method 800 can be implemented, for example, with the above-described calibration apparatus 500 to provide calibration data for the above-described RF plasma generation system 100. Where the following description, for clarity, refers to components of the RF plasma generation system 100, the references should not be considered as limiting the method 300 to implementation for the RF plasma generation system 100.

The method 800 is generally applicable, for example, to calibration of plasma generation systems that include an impedance matching network and a plasma vessel associated with a load. The method 800 includes providing a calibration load (such as the load 500), that represents the load associated with the plasma vessel (Step 810). The calibration load has an input port in electromagnetic communication with an output port of an impedance matching network.

The method includes applying a sequence of RF signals to the input port of the impedance matching network (Step 820), which in turn causes the sequence of RF signals to be applied to the input port of the calibration load. The method also includes determining at least one parameter associated with the sequence of RF signals applied to the input port of the impedance matching network (Step 830) and determining at least one characteristic of the calibration load responsive to the sequence of RF signals (Step 840).

The method can further include storing calibration data that associates values of the at least one signal parameter and values of the at least one characteristic of the calibration load (Step 850). Steps of the method can be repeated for each of a plurality of calibration load impedances, to survey a range of impedances associated with a plasma vessel.

The at least one parameter associated with the sequence of RF signals can be, for example, a current of the RF signal. For example, the probe 20 can be a current probe, and thus detect the current of the RF signal associated with the input port 11 of the impedance matching network 10. Calibration data obtained via the method 800 can then permit determination of characteristics of the plasma vessel 50, for example, impedance and/or power consumption, with relatively good accuracy and precision. The calibration data can be used to prepare lookup tables, which can be stored, for example, in the calibration data unit 40 for use by the control unit 30 during operation of the RF plasma generation system 100. For example, the lookup tables can contain data that relates an RF signal reflection coefficient to the plasma vessel 50 load impedance and to the power delivery efficiency for the load.

The application of the sequence of RF signals to the input port of the impedance matching network (Step 820) can entail ramping the power of the RF signal over a range of interest, for each of a series of selectable impedances of the calibration load. The at least one parameter determined at Step 830 can be, for example an RF signal current. The at least one characteristic of the calibration load determined at Step 840 can be the power delivered to the calibration load, as determined, for example, via a current-voltage probe in the calibration load or calorimetry measurements of the calibration load. Accordingly, correlations between the at least one parameter of the RF signal and the at least one characteristic of the calibration load can be developed and embodied in the form of calibration data.

While the invention has been particularly shown and described with reference to specific preferred embodiments, it should be understood by those skilled in the art that various changes in form and detail may be made therein without departing from the spirit and scope of the invention as defined by the appended claims.

What is claimed is:

1. A method for operating an RF plasma generation system, the method comprising the steps of:
    applying an RF signal to an input port of an impedance matching network having a fixed impedance during operation of the system;
    monitoring at least one parameter of the RF signal associated with the input port of the impedance matching network;
    providing an output of the impedance matching network to a plasma load;
    providing calibration data that associates values of the at least one RF signal parameter with values of at least one characteristic of the load; and
    determining a value of the at least one characteristic of the load associated with the monitored value of the at least one parameter of the RF signal by referencing the calibration data.

2. The method of claim 1 comprising providing control information to control operation of the RF plasma generation system.

3. The method of claim 1 wherein the at least one parameter associated with the RF signal at the input of the impedance matching network is one or more of a voltage, a current, a phase, and a power of the signal.

4. The method of claim 1 comprising providing control signals to an RF generator.

5. The method of claim 1 wherein monitoring at least one parameter of the RF signal associated with the input of the impedance matching network comprises probing the RF signal at a location along a pathway of the RF signal between an RF signal generator and the input of the impedance matching network.

6. The method of claim 1 wherein the calibration data comprise power efficiency data comprising values of a ratio of,
    i) a power delivered to the load, to
    ii) a power of the RF signal at the input of the impedance matching network.

7. The method of claim 1 wherein the at least one parameter associated with the RF signal is a reflection coefficient of the RF signal.

8. The method of claim 1 comprising changing a power of the RF signal associated with the input of the impedance matching network if the monitored value of the characteristic of the load is different from at least one predetermined load criterion.

9. The method of claim 1 wherein monitoring at least one parameter of the RF signal associated with the input port of the impedance matching network comprises monitoring a present value of the at least one parameter.

10. The method of claim 1 comprising adjusting a frequency of the RF signal in response to determining the value of the at least one characteristic of the load associated with the monitored value of the at least one parameter of the RF signal by referencing the calibration data.

11. An RF plasma generation system comprising:
    an impedance matching network having a fixed impedance during operation of the system and having an input, to receive an RF signal from an RF generator, and an output, to deliver the RF signal to an input of a plasma vessel associated with a load;
    a signal probe in electromagnetic communication with the input of the impedance matching network to detect at least one parameter associated with the RF signal at the input of the impedance matching network;
    a calibration storage unit comprising calibration data that associates,
    i) values of the at least one RF signal parameter associated with the input port of the impedance matching network, with,
    ii) values of at least one characteristic of the load; and a control unit to determine an association between the detected at least one RF signal parameter and a monitored value of the at least one characteristic of the load by referencing the calibration data.

12. The system of claim 11 wherein the control unit is implemented by one or more of software, firmware and hardware.

13. The system of claim 11 wherein the calibration storage unit and the control unit are implemented within a single piece of hardware.

14. The system of claim 11 comprising an interface to accept control information.

15. The system of claim 11 wherein the at least one parameter associated with the RF signal at the input of the impedance matching network is one or more of a voltage, a current, a phase, and a power of the signal.

16. The system of claim 11 wherein the control unit is in communication with the RF generator.

17. The system of claim 11 wherein the control unit provides control signals to the RF generator.

18. An RF plasma generation system comprising:
 an impedance matching network having a fixed impedance during operation of the system and having an input, to receive an RF signal from an RF generator, and an output, to deliver the RF signal to an input of a plasma vessel associated with a load;
 a signal probe in electromagnetic communication with the input of the impedance matching network to detect at least one parameter associated with the RF signal at the input of the impedance matching network;
 a calibration storage unit comprising calibration data that associates,
  i) values of the at least one RF signal parameter associated with the input port of the impedance matching network, with,
  ii) values of at least one characteristic of the load; and
 means for determining an association between the detected at least one RF signal parameter and a monitored value of the at least one characteristic of the load by referencing the calibration data.

19. The method of claim 1 wherein the impedance matching network has a plurality of fixed impedances associated with a plurality of operating recipes of the RF plasma generation system.

20. The method of claim 1 wherein the impedance matching network can be reconfigured with a different fixed impedance.

21. The method of claim 1 wherein the RF signal is a variable frequency RF signal.

22. The system of claim 11 wherein the impedance matching network has a plurality of fixed impedances associated with a plurality of operating recipes of the RF plasma generation system.

23. The system of claim 11 wherein the impedance matching network can be reconfigured with a different fixed impedance.

24. The system of claim 11 wherein the RF generator is a variable frequency RF generator.

* * * * *